(12) United States Patent
Marek et al.

(10) Patent No.: US 7,408,353 B2
(45) Date of Patent: Aug. 5, 2008

(54) COOLED NMR PROBE HEAD WHICH CAN BE COUPLED

(75) Inventors: Daniel Marek, Moeriken (CH); Marco Sacher, Uster (CH); Tobias Leutenegger, Zurich (CH)

(73) Assignee: Bruker Biospin AG, Faellanden (CH)

( * ) Notice: Subject to any disclaimer, the term of this patent is extended or adjusted under 35 U.S.C. 154(b) by 0 days.

(21) Appl. No.: 11/727,670

(22) Filed: Mar. 28, 2007

(65) Prior Publication Data
US 2007/0257675 A1 Nov. 8, 2007

(30) Foreign Application Priority Data
May 3, 2006 (DE) .................. 10 2006 020 774

(51) Int. Cl.
*G01V 3/00* (2006.01)
(52) U.S. Cl. ..................... 324/318; 324/321
(58) Field of Classification Search .......... 324/318, 324/321, 322
See application file for complete search history.

(56) References Cited

U.S. PATENT DOCUMENTS

| 5,829,791 | A | 11/1998 | Kotsubo |
| 5,889,456 | A | 3/1999 | Triebe |
| 5,913,888 | A | 6/1999 | Steinmeyer |
| 6,677,751 | B1 | 1/2004 | Marek |
| 7,030,613 | B2 * | 4/2006 | Morita et al. ............. 324/318 |
| 7,151,374 | B2 * | 12/2006 | Doty ..................... 324/321 |
| 7,288,939 | B1 * | 10/2007 | Barbara et al. ........... 324/322 |
| 7,295,010 | B2 * | 11/2007 | Fukuda et al. ............ 324/318 |
| 2004/0212364 | A1 | 10/2004 | Morita | |
| 2005/0046423 | A1 | 3/2005 | Marek | |
| 2006/0038567 | A1 | 2/2006 | Morita | |

FOREIGN PATENT DOCUMENTS

| JP | 2004/037236 | 2/2004 |
| WO | WO 2003/050554 | 6/2003 |

OTHER PUBLICATIONS

R. Haueisen, et al. "Cryogenic probe setup for routine MR imaging on small animals at 9.4 T". ESMRMB, Basel, Sep. 16, 2005.

* cited by examiner

*Primary Examiner*—Louis M Arana
(74) *Attorney, Agent, or Firm*—Paul Vincent

(57) ABSTRACT

A magnetic resonance (MR) probe head comprises a detecting device (3) with at least one antenna system which is cryogenically cooled by a cooling device, a cooled preamplifier (16) in a preamplifier housing (15a, 15b) which is spatially separated from the detecting device (3), and a thermally insulating connecting means via which the detecting device (3) and the preamplifier housing (15a, 15b) are connected, wherein the connecting means (15c) comprises at least one cooling line (9a, 9b, 53a, 53b) for supplying and/or returning a cooling fluid, and at least one RF line (10, 52) for transmitting electric signals. The connecting means (15c), including its RF and cooling lines (10, 52, 9a, 9b, 53a, 53b), can be separated from the preamplifier housing (15a, 15b) by a coupling. The MR probe head is an open system which can be used in a universal fashion through use of different measuring inserts. The system can be expanded for further measuring configurations at little cost and can be easily handled in a time-saving fashion with an optional arrangement having a flexible connecting line.

32 Claims, 9 Drawing Sheets

COOLED NMR PROBE HEAD WHICH CAN BE COUPLED

This application claims Paris Convention priority of DE 10 2006 020 774.2 filed May 3, 2006 the complete disclosure of which is hereby incorporated by reference.

BACKGROUND OF THE INVENTION

The invention concerns a magnetic resonance (MR) probe head with a detecting device, comprising at least one antenna system which is cryogenically cooled by a cooling device, and a cooled preamplifier in a preamplifier housing which is disposed at a spatial separation from the detecting device, and with a thermally insulating connecting means for connecting the detecting device to the preamplifier housing, wherein the connecting means comprise at least one cooling line for supplying and/or returning a cooling fluid, and at least one radio frequency (RF) line for transmitting the electrical signals.

Cooled MR probe heads are disclosed e.g. in references [1]-[3] listed below and are used for detecting MR signals from a sample. The receiver coil is thereby cooled. This receiver coil may consist of normally conducting metal, e.g. copper or aluminium or of superconducting materials, in particular, of high-temperature superconductors (HTSC).

The MR probe head disclosed in [3] describes a system that is cooled by a cryocooler 20, wherein the cryocooler 20 is disposed at a certain separation from the actual probe head. This cryocooler 20 is usually a Gifford-McMahon cooler but may also be a pulse tube cooler. The probe head is generally cooled via a flexible transfer line 19 with continuing lines 21a, 21b, 21c, 21d which extend to a preamplifier 16 or to the receiver coil 5 via cooling lines 53a, 53b. Although the cooling lines 53a, 53b are small tubes or the like, they are represented as a line in this illustration and also in the other figures. The transfer line 19 bridges the distance to the cryocooler 20 and also keeps vibrations away from the probe head. A heat transporting medium (cooling fluid), normally cold gaseous helium, circulates in this transfer line 19. The probe head itself usually comprises at least one receiver coil 5 and at least one preamplifier 16 which are connected to each other via a rigid connecting means 15c with RF lines 52. The entire probe head is designed as one rigid unit. Such an MR probe head is shown in FIG. 9 in a room temperature bore 2 of a magnet 1 for a vertical magnet system.

This is a high performance configuration, since the RF receiver coil 5 is operated in the room temperature bore 2 of the magnet 1 at a very low temperature (e.g. 20 K), and the preamplifier 16 is operated at a such a low temperature to still ensure satisfactory function (e.g. 77 K). The RF line 52 between the receiver coil 5 and the preamplifier 16 is also at a low temperature. The temperature usually changes along the RF line 52 from 20 K to 77 K, wherein the geometry (in particular the cross-section of the cables of the RF line 52) is thereby selected such that an optimum is achieved between minimizing the RF line loss and minimizing the heat input into the cold receiver coil 5, which results from the thermal conductivity of the RF line 52. Thus, the S/N ratio of the system is optimized. After amplification with the cooled preamplifier 16, the signal is finally passed to a signal output 17 for further signal processing. The complete MR probe head may be cooled with one single cryocooler 20 (Gifford McMahon or also pulse tube cooling head).

The MR probe head may be separated from the cryocooler 20 via a coupling with coupling parts 18a, 18b for inserting and removing the MR probe head. Such a coupling is disclosed e.g. in [5] and [3]. The entire probe head including the normally large preamplifier 16 and an associated preamplifier housing 15a is however quite heavy, such that installation/removal generally requires two persons.

In particular, magnetic resonance imaging (MRI) often utilizes many different RF measuring coils. These are required to permit optimum adjustment to the test object and the particular investigation. This includes e.g. whole body coils (e.g. birdcage resonator) or surface coils. Different sizes or configurations are also used, e.g. for investigating the brain, joints, or spinal column. Array coils are moreover also increasingly used.

The above-described configuration may also be determined for different living beings, e.g. for a mouse or a rat. Clearly, this also requires scaling of the detecting device to different sizes.

This also applies for so-called micro imaging systems which are used for magnets with smaller room temperature bores but very high field strengths (up to more than 17T) in order to image smaller samples. This also requires a plurality of receiver coils.

In a fixed assembled unit of receiver coil(s) and preamplifier, each application requires one complete probe head containing the expensive cooled preamplifiers, and a large part of the cryotechnical hardware. This results in high costs for each configuration as well as great handling difficulties, since for each change the entire probe head, including the heavy preamplifier unit, must be exchanged.

It is therefore the underlying purpose of the present invention to propose an MR probe head which can be universally used and can be expanded for further measuring configurations in an inexpensive fashion.

SUMMARY OF THE INVENTION

This object is achieved in accordance with the invention in that the connecting means including RF and cooling lines can be separated from the preamplifier housing using a coupling.

The inventive coupling primarily connects the detecting device to the preamplifier in a detachable fashion, such that the preamplifier can be used for different applications and only the detecting device must be exchanged. This also reduces the overall costs of the required components.

The inventive MR probe head is advantageously a probe head for magnetic resonance imaging (MRI) applications or for nuclear magnetic resonance (NMR) spectroscopy. In particular, in MRI applications that utilize many different detecting devices, the inventive MR probe head that can be coupled proves to be advantageous.

Instead of cooling the MR probe head using one single cooling line, wherein the coolant evaporates at the components to be cooled, in a particularly advantageous fashion, the inventive MR probe head has two cooling lines which are part of a first cooling circuit. It is thereby possible to re-cool the coolant or also re-liquify it and use it again.

In a preferred embodiment of the invention, the coupling has a fluid coupling device with fluid coupling elements for coupling the at least one cooling line, which extends to the detecting device, to at least one continuing cooling line section on the side of the preamplifier housing, and an RF line coupling device, wherein the RF line coupling device comprises at least one first RF line coupling element, in particular, an RF plug on the side of the antenna system, and at least one second RF line coupling element, in particular, an RF socket, for coupling the RF lines to the signal input of the preamplifier.

With particular preference, a spring element is provided for at least one pair of first and second RF line coupling elements, which forces the first RF line coupling element and the associated second line coupling element against each other. This embodiment ensures perfect contact between the RF sockets and the RF line coupling elements even when the component dimensions change.

The RF line coupling elements and/or a vacuum jacket that surrounds the first RF line coupling elements, are advantageously cooled by a thermal stage to prevent heat input into the RF line via the RF line coupling device.

In a further development of this embodiment, the thermal stage of the RF line coupling elements is thermally connected to a heat exchanger of the preamplifier, a thermal stage of the preamplifier or the preamplifier itself.

The electronics of the cooled preamplifier is advantageously cooled by a second cooling circuit which is separate from the at least one cooling line.

A heat exchanger is advantageously provided for cooling the thermal stage of the RF line coupling elements, which is disposed in the feed line of the first or second cooling circuit.

This thermal stage advantageously has a temperature below the preamplifier temperature during operation to prevent any unnecessary heat input into the preamplifier.

In one particularly advantageous embodiment of the inventive MR probe head, the coupling comprises a vacuum connection for coupling to a vacuum line. The connecting means may thereby be evacuated via the vacuum line for insulation purposes.

In a particularly advantageous embodiment of the inventive MR probe head, the connecting means is designed as a mechanically flexible connecting line with mechanically flexible RF and cooling lines. The flexible design both of the connecting means and of the RF and cooling lines minimizes the space required for installation and removal of the MR probe head. The detecting device that forms part of the probe head and which is operated in the direct vicinity of the object to be investigated to receive the RF signals, can therefore be quickly installed into the magnet and placed into operation. The detecting device can also be quickly and simply shut down after termination of measurements, and be removed from the room temperature bore of the magnet. In particular, when the examination methods and thus the detecting device are exchanged frequently, unproductive inoperative times of the very expensive magnet system can be reduced. Due to the inventive coupling in combination with the flexible connecting line, the preamplifier can remain in the respective MR system during exchange of the detecting device and the preamplifier housing may remain evacuated.

In a particularly preferred embodiment of the invention, one or more RF lines are associated with each single cooling line, where they each form, together with the associated cooling line, one line package. The lines within one line package are tightly arranged, such that the temperature is balanced between the individual lines within the line package.

In a further development of this embodiment, the cooling line and the RF lines associated with the cooling line, of one single line package are thermally connected to each other, preferably in regular separations, via coupling elements having good thermal conducting properties. These coupling elements may be produced e.g. from copper.

In a further development, at least one of the line packages contains at least one elastic reinforcing element, in particular, a wire having high mechanical integrity to reduce the mechanical tensile and bending strain of the RF and cooling lines. The reinforcing element may e.g. be made from stainless steel.

In a preferred embodiment, the individual line packages are twisted, preferably at least once, about the axis of the connecting line along the entire length of the connecting line.

With particular advantage, the RF lines and/or the elastic reinforcing elements within the packages are twisted with the cooling line between two coupling elements through substantially 360 degrees or an integer multiple thereof, in particular, wound about the cooling line. The overall length of all lines between the coupling elements thereby remains substantially the same when they are bent. In consequence thereof, the lines do not bulge or bend when the connecting line is bent. The cooling line may also be twisted about the RF lines and/or the elastic reinforcing elements, or both together. The cooling line may also be previously twisted about the RF line.

The RF line of the inventive MR probe head advantageously comprises a flexible coaxial cable preferably with polytetrafluoroethylene (PTFE) insulation, wherein the outer conductor consists of a combination of a metal braiding and a spirally wound metal foil having good electric conducting properties.

With particular advantage, the cold parts of the connecting line, in particular, the cooling lines and the RF lines, are disposed in a vacuum within at least one flexible outer jacket for thermal insulation. In this fashion, in particular, through super insulation, the heat input into the cold parts of the MR probe head is minimized. The connecting line may also comprise two parallel hose lines as an outer jacket, wherein one hose line houses the feed line and the other the return line, each comprising a number of associated RF lines. This configuration is advantageous in that each of the two hose lines may have a smaller diameter and thereby be more flexibly designed. However, an embodiment with one single outer jacket is advantageous, since its thermal insulation is improved due to a smaller overall surface for a given cross-section and constitutes a simpler, more robust and neater configuration (seen from the outside) while exhibiting an isotropic bending behavior.

In a particularly preferred embodiment, the first and the second cooling circuit are cooled by the same cooling device, such that the costs and also the space for a further cooling device are obviated.

Helium is preferably provided as a cooling fluid for cooling the components of the MR probe head.

The cooling device may advantageously be a Gifford-McMahon cooler.

The cooling device may alternatively be a pulse tube cooler.

The antenna system is advantageously operated at a lower temperature than the preamplifier.

In a further development of this embodiment, the antenna system is operated at a temperature in the range of 4 to 40 K and the preamplifier is operated at a temperature in the range of 40 to 100 K.

In a particularly preferred embodiment of the inventive MR probe head, the separation between the preamplifier and the last coupling element on the side of the preamplifier is larger than the average separation between two coupling elements. There is no thermal contact between the RF line and the cooling line along the path between the preamplifier and the last coupling element on the preamplifier side, such that the temperature of the RF lines corresponds substantially to the temperature of the cooling lines or the temperature of the receiver coils, and the temperature transition to the preamplifier temperature takes place only shortly before the preamplifier. While a sufficiently dense (tightly arranged) configuration of coupling elements cools the RF line in a large area along the RF line, this coupling is no longer provided on the above-described path for the temperature transition to the preamplifier, such that the temperature can rise steadily.

With respect to handling, the mass of the parts of the detecting device is advantageously less than 5 kg.

In a particularly preferred embodiment of the inventive MR probe head, the preamplifier comprises several parallel preamplifier channels. When e.g. array coils are used as the antenna system, several preamplifier channels are required, with each of these channels being associated with a receiver coil which is disposed at a separate location. Each of the receiver coils is connected to its own preamplifier. This substantially accelerates data acquisition through parallel measurement. The configuration can also assume different patterns. For imaging the brain, e.g. 2×2 coils could be used, which are disposed in a square configuration, whereas a linear array of 1×4 coils is preferred for an examination of the spinal column.

The preamplifier may advantageously comprise several, in particular 2, 3, 4, 6, 8, 12 or 16, parallel channels for the same nucleus to be examined, in particular, 1H.

In a further embodiment of the invention, the preamplifier comprises channels for amplifying the signals of the nuclei 31P, 13C, 23Na, 19F, 17O, 129Xe or 2H.

The invention also concerns an MR system comprising the above-described inventive probe head.

The invention can be utilized with particular advantage when the MR system is an MRI or an NMR system.

The inventive MR probe head constitutes an open system which can be operated in a very universal fashion through use of different measuring inserts. The probe head can also be expanded for further measuring configurations in an inexpensive fashion, and can be handled in a very easy and rapid fashion when optionally arranged with a flexible connecting line.

Further advantages of the invention can be extracted from the description and the drawing. The features mentioned above and below may be used individually or collectively in arbitrary combination. The embodiments shown and described are not to be understood as exhaustive enumeration but have exemplary character for describing the invention.

DESCRIPTION OF THE PREFERRED EMBODIMENT

Figure 1:
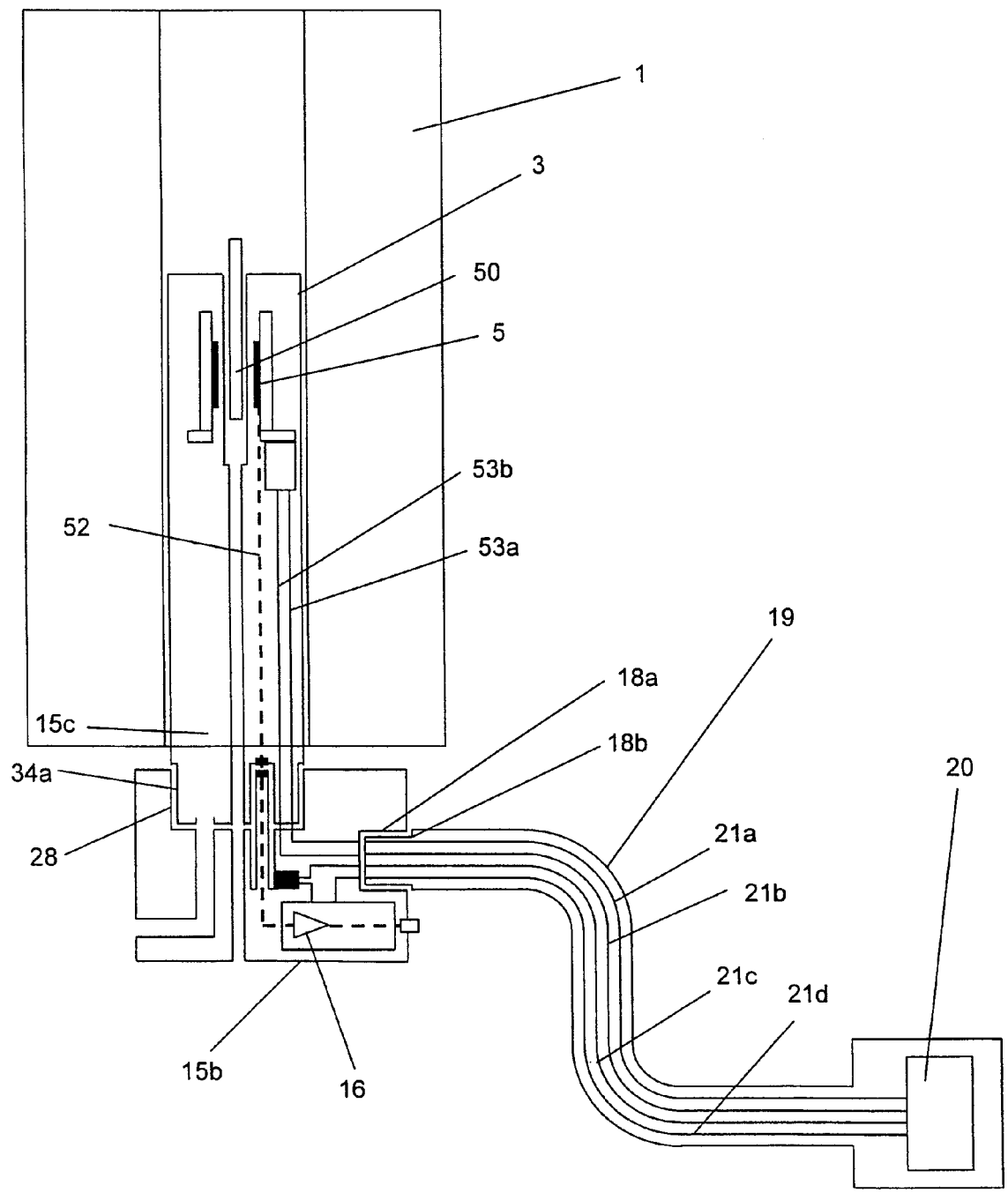
FIG. 1 shows an inventive MR probe head in a vertical magnet.
Figure 2:
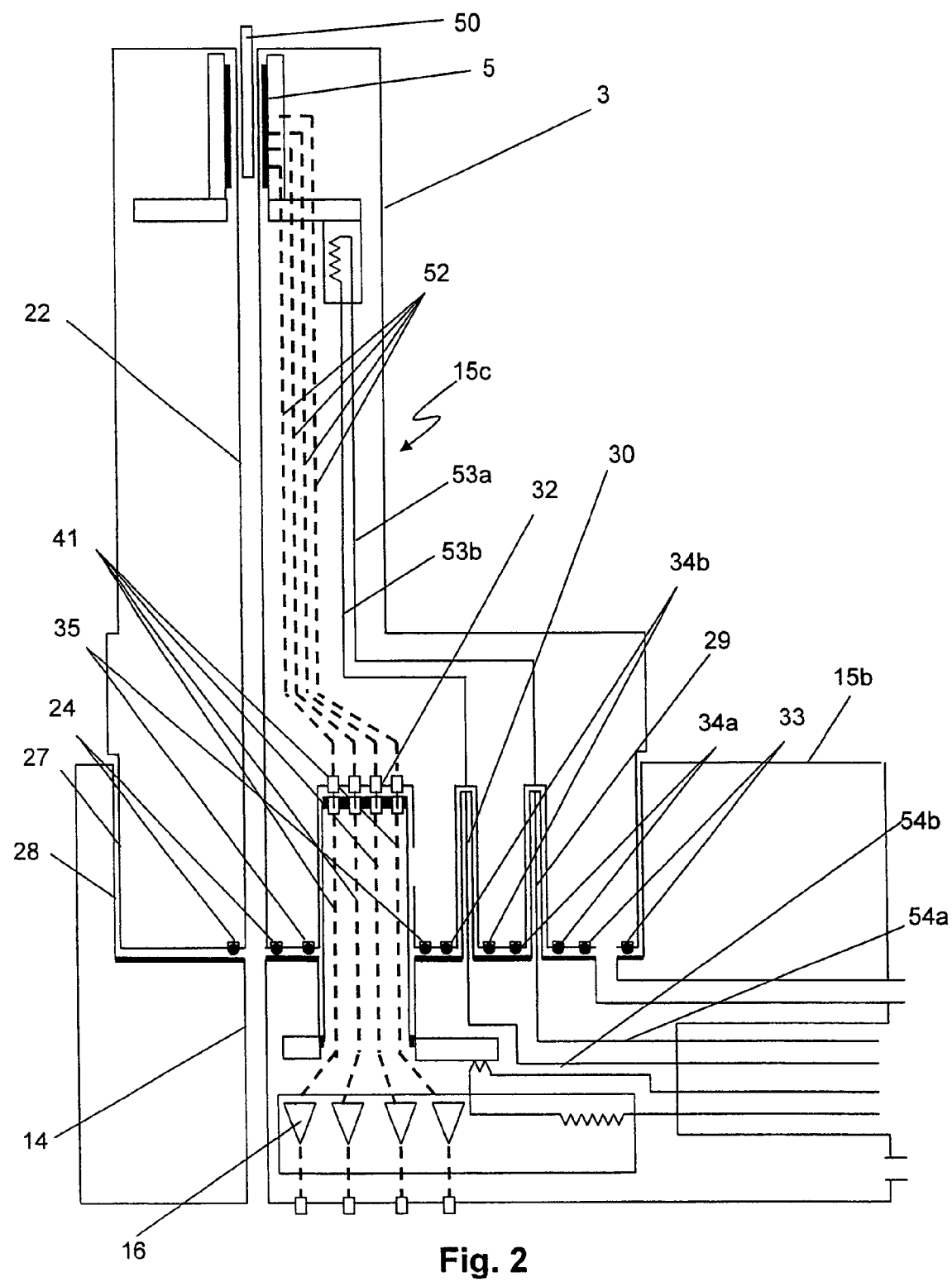
FIG. 2 shows an inventive MR probe head with the essential components of an inventive coupling between the preamplifier housing and the detecting device.
Figure 4:
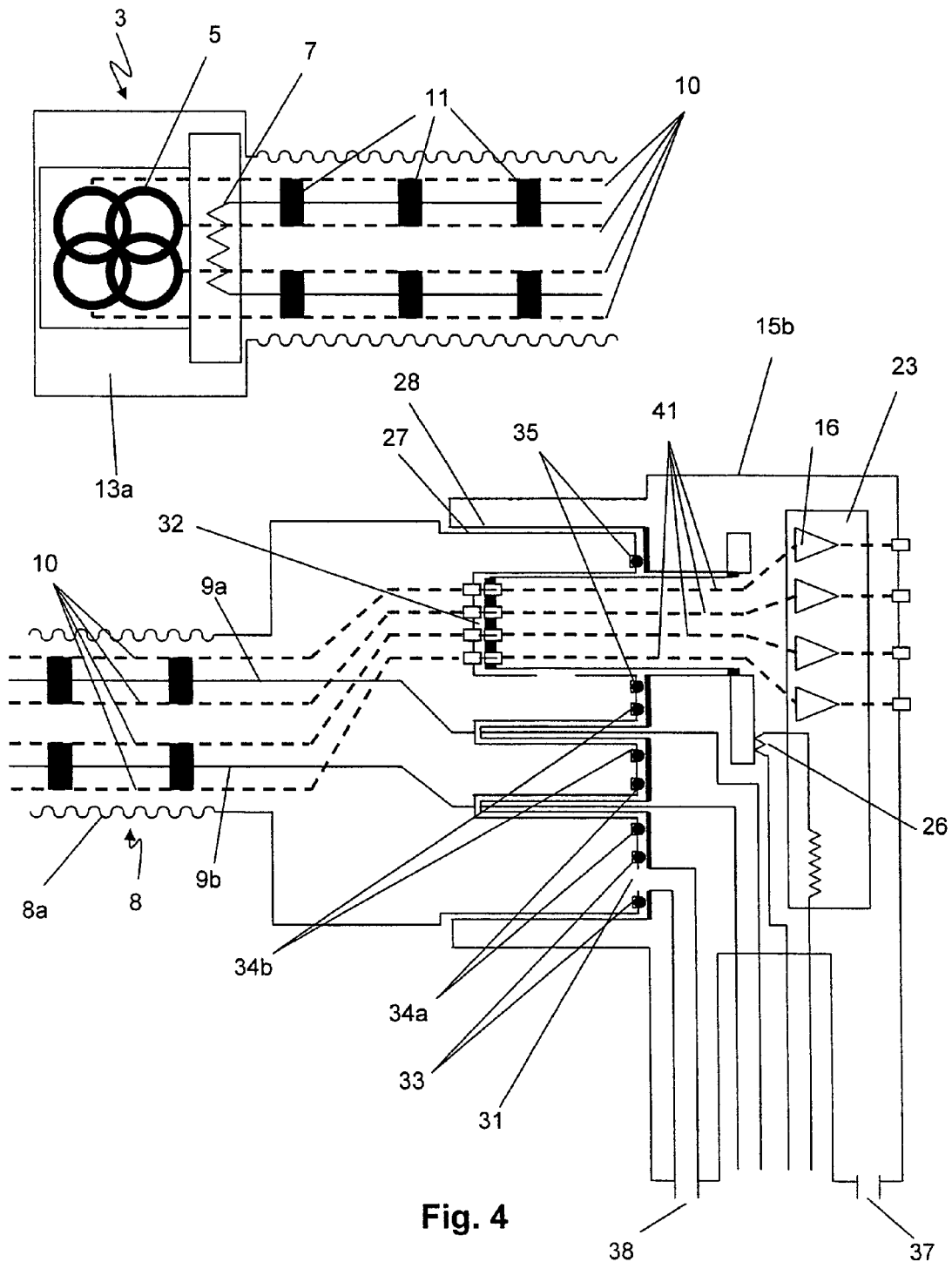
FIG. 4 shows a section of an inventive MR probe head with flexible connecting line.
Figure 7:
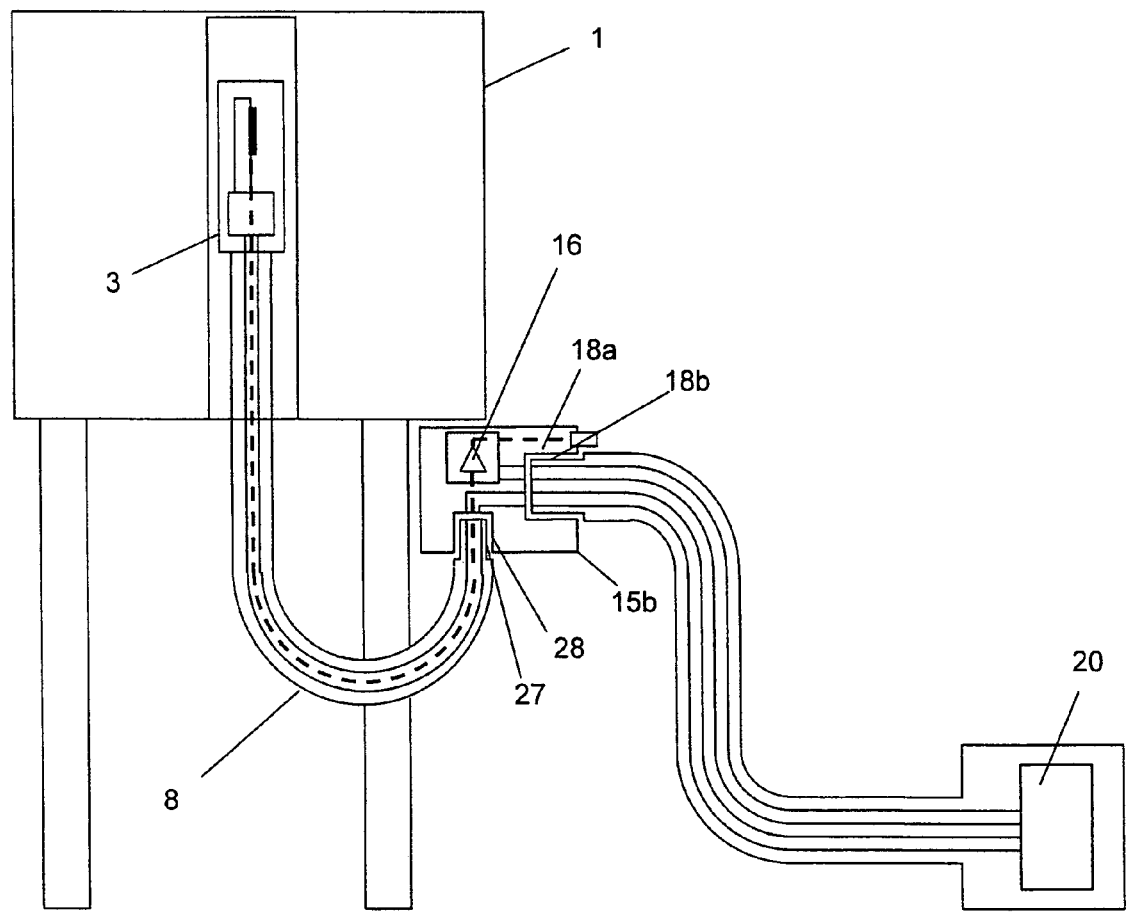
FIG. 7 shows an inventive NMR probe head with a flexible connecting line in a vertical magnet for high-resolution NMR spectroscopy.
Figure 8:
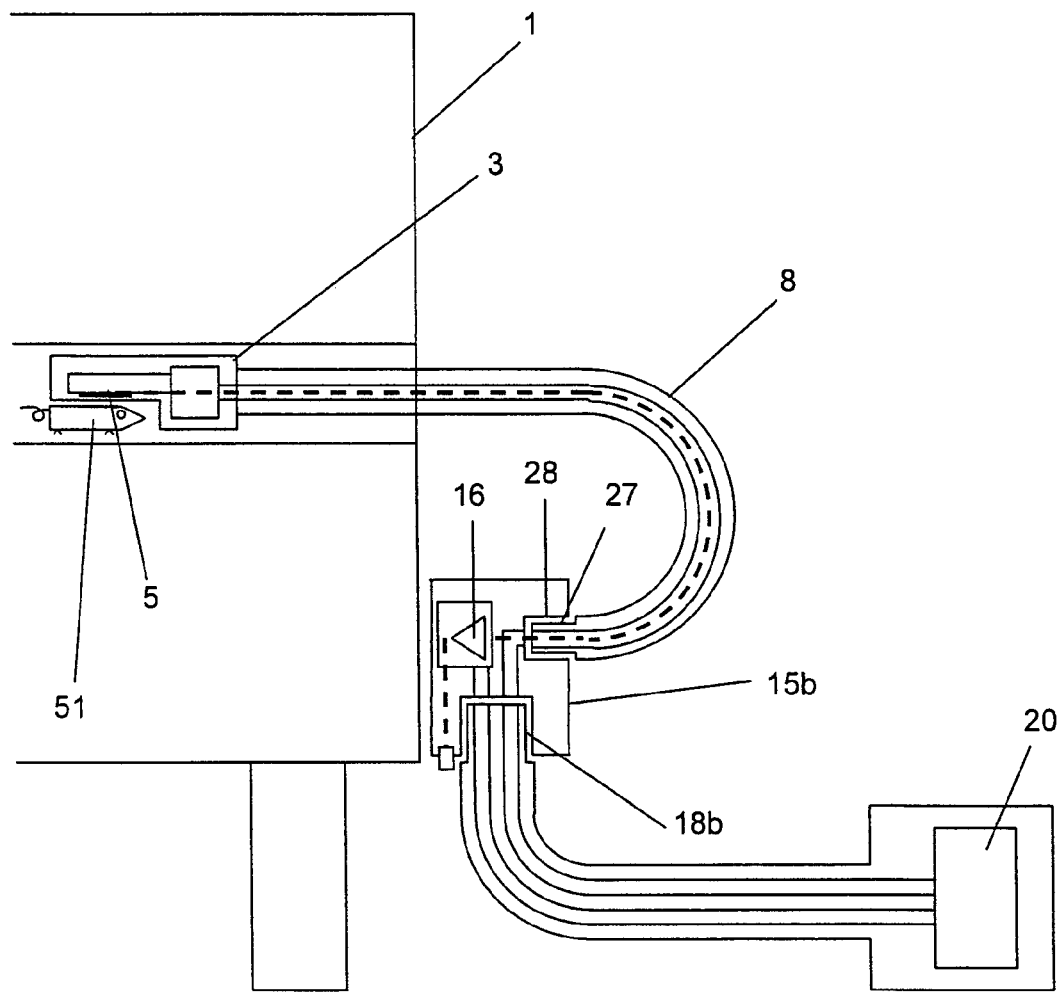
FIG. 8 shows an inventive MRI probe head with flexible connecting line in a horizontal magnet for MRI applications.

The inventive probe head for receiving NMR signals is shown in FIG. 1 (within a magnet 1) and FIG. 2 and comprises the following components:

a) a detecting device 3 with at least one cryogenically cooled antenna system. The antenna system of the inventive MR probe head comprises at least one antenna, wherein such an antenna may consist of at least one receiver coil 5, or a resonator, or another type of RF oscillating circuit which is sensitive to electromagnetic fields. In order to eliminate or at least minimize thermal transfer from a measuring sample 50 to the antenna system, the inventive MR probe head in accordance with FIGS. 1 and 2 has a room temperature tube 22, which is permeable to RF radiation, e.g. of quartz, through which warm air may flow past the sample 50. The detecting devices 3 in accordance with FIGS. 1 and 2, as described herein, are mainly systems for NMR spectroscopy or microimaging. MRI systems for the examination, in particular, imaging of objects, and in particular of living beings may have surface coils. These are separated from the test object by an RF permeable wall which can be directly or indirectly heated. Such systems are typically used for MRI imaging and are shown in FIGS. 4, 7 and 8.

b) a cooled preamplifier 16 in a separate preamplifier housing 15b, which is spatially separated from the detecting device 3.

c) a connecting means which is thermally insulated from the surroundings (in the present case a rigid connecting means 15c) for connecting the detecting device 3 to the preamplifier housing 15b, wherein the rigid connecting means 15c has cooling lines 53a, 53b of a first cooling circuit for supplying or returning a cooling fluid, and RF lines 52 for transmitting electric signals.

d) a coupling with a coupling part 27 on the side of the detecting device, and a coupling part 28 on the side of the preamplifier. The coupling comprises an RF line coupling device 32 (FIG. 2) and a fluid coupling device with fluid coupling elements 29, 30 (FIG. 2) for coupling the cooling lines 53a, 53b which extend to the detecting device 3, to the cooling line sections 54a, 54b on the side of the preamplifier. The inventive coupling moreover connects the room temperature tube 22 with a room temperature feedthrough 14, which extends through the preamplifier housing 15b, via an O-ring 24.

Figure 9:
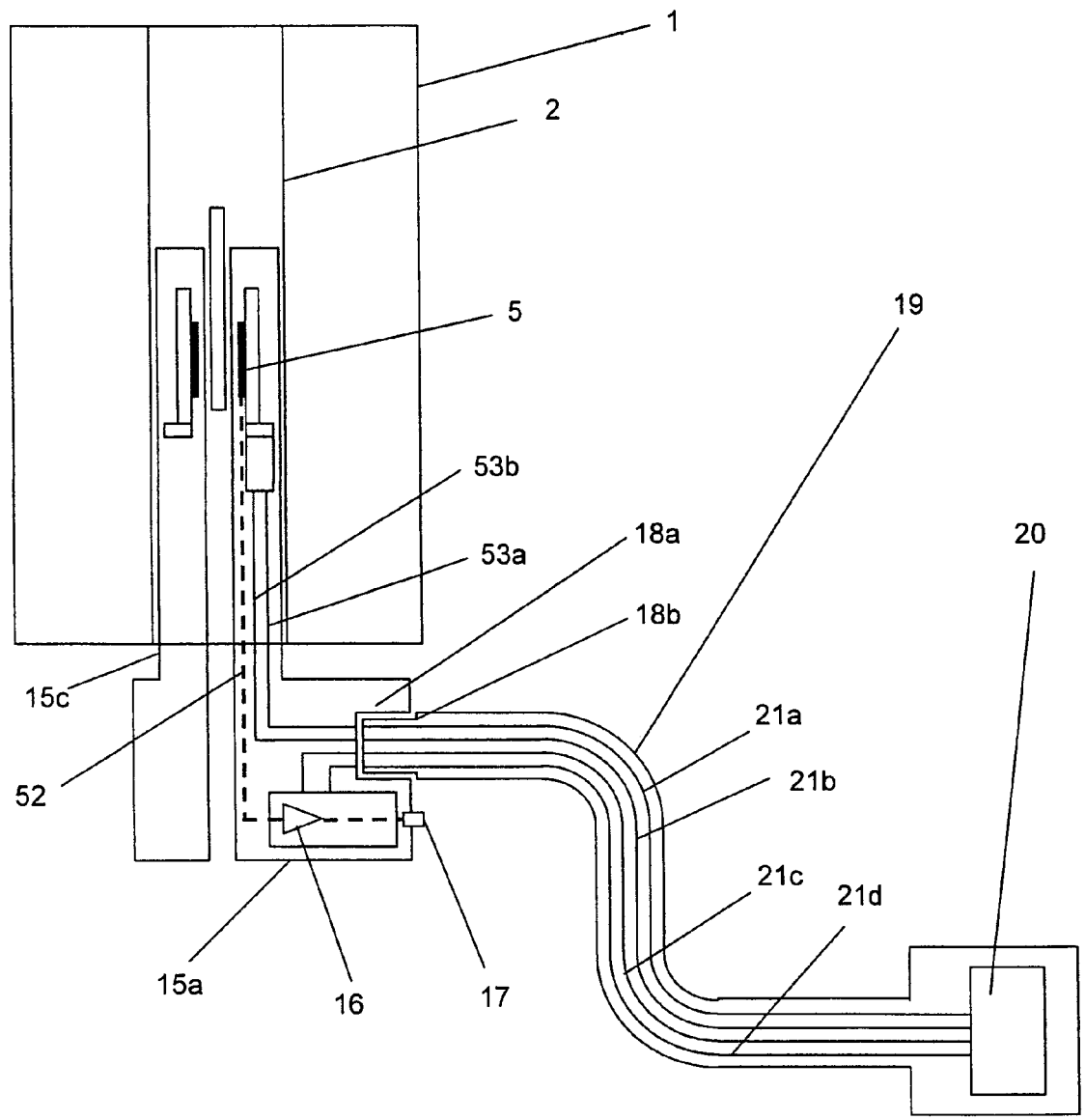
FIG. 9 shows an NMR probe head with a rigid connecting means in accordance with prior art in a vertical magnet for high-resolution NMR spectroscopy.

The fluid coupling device may be designed in accordance with a conventional coupling between the MR probe head and a transfer line 19 leading to a cryocooler 20, with coupling parts 18a, 18b (FIG. 1, FIG. 9). It comprises substantially mutually engaging, normally thin steel tubes, which are each sealed on the room temperature side with one O-ring 34a and 34b (FIG. 2) for each cooling line 53a, 53b.

Figure 3:
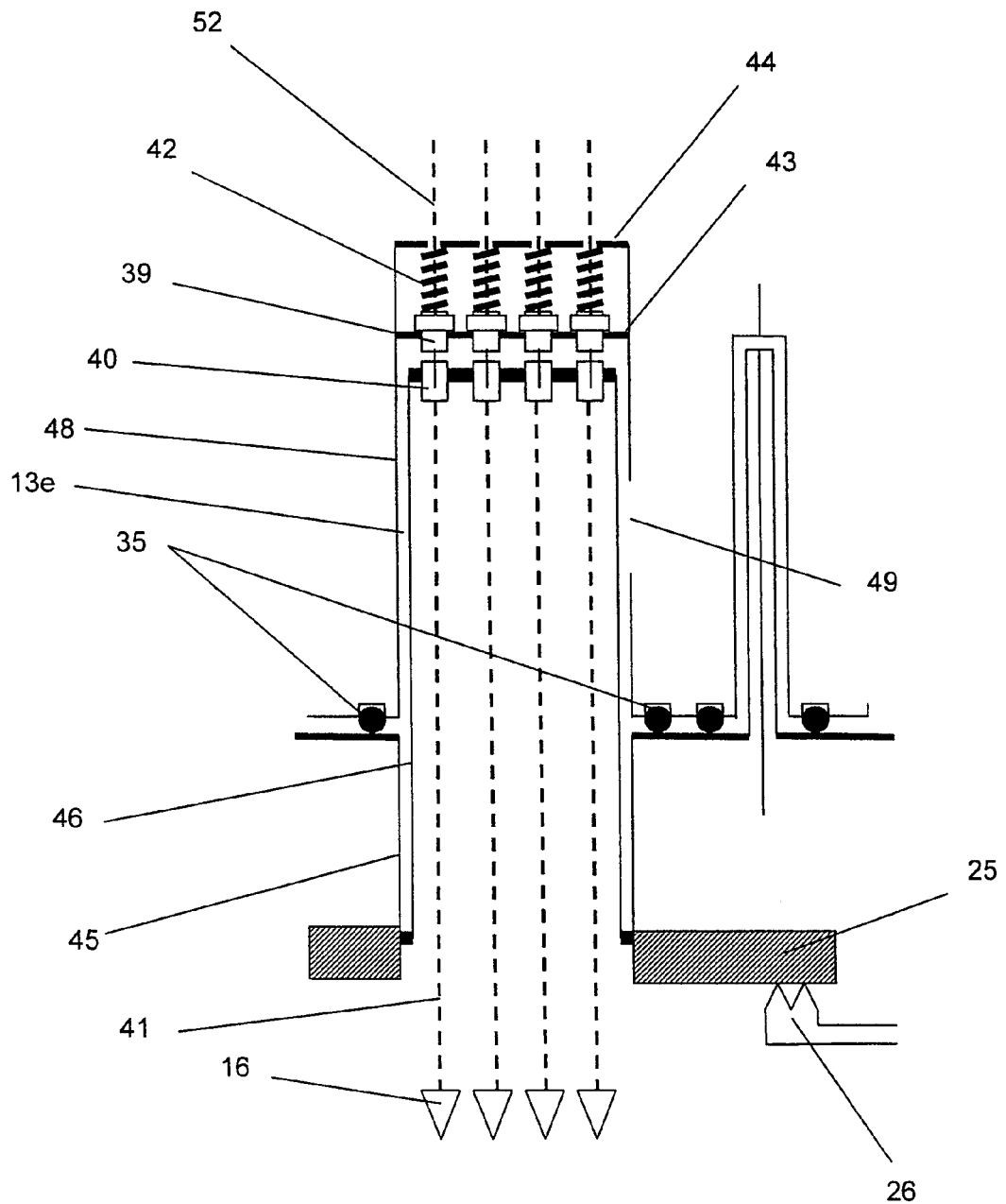
FIG. 3 shows a detailed representation of an inventive RF line coupling device.

The substantial element of the inventive MR probe head is the RF line coupling device 32 for the RF lines 52 between the receiver coil 5 and the preamplifier 16. The RF lines 52 are advantageously continuously cold during operation. The RF line coupling device 32 is designed to ensure reliable and safe RF connection even during cold operation, and comprises the following elements shown in FIG. 3:

a vacuum jacket 46 ("bulge") in the vacuum housing of the preamplifier, formed from a material with advantageously good thermal conductivity (e.g. copper tube).

on the preamplifier side, the vacuum jacket 46 has a further jacket 45 made from a material with poor thermal conductivity (e.g. of a steel tube with very thin walls), and, on the detecting device side, is surrounded by a holder 48 having a ventilation opening 49. The vacuum jacket 46 and the further jacket 45 are separated by an intermediate temperature tap in the form of a thermal stage 25, which is connected to a small heat exchanger 26. The function of this configuration is described in detail below.

RF sockets 40 are provided at the end of the vacuum jacket 46. The RF sockets 40 are advantageously vacuum tight, either directly or via an upstream vacuum feedthrough. They are each connected via a continuing RF line 41 to the preamplifiers 16. Moreover, the RF sockets 40 are preferably designed such that they can be coupled directly and linearly to a matching RF plug 39 on the detecting device side without screwing or rotation.

the RF plugs 39 on the detecting device side are advantageously guided in a guidance 43 such that they can be displaced in the longitudinal direction, and are commonly or, even better, individually, provided with spring elements 42 (pressure springs) which are mechanically supported e.g. on a counter plate 44. This embodiment always ensures complete pressing-on and thus perfect RF transmission even when the dimensions change which may happen due to cooling, in particular, of the structural parts 45, 46, 48. The RF plugs 39 may be directly connected to the RF lines 52 which extend to the receiver coils 5.

FIG. 4 shows a particularly advantageous embodiment of the inventive MR probe head with a flexible connecting line 8 as a connecting means, via which the detecting device 3 and the preamplifier housing 15b are connected. The connecting line 8 comprises a vacuum-tight outer jacket, in the present case in the form of a corrugated bellows 8a, two flexible cooling lines 9a, 9b, and flexible RF lines 10 and is shown in a stretched state, wherein the upper part of the figure shows the continuation of the lines 52. The continuing RF line 41 between the RF line coupling device 32 and the preamplifier 16 need not be flexible. The lines 9a, 9b, 10 are thermally coupled to each other via coupling elements 11. Such a coupling element 11 normally consists of a Cu cylinder, to which the cooling line 9a, 9b, the flexible RF line 10 and any further elements are mechanically and thermally connected, advantageously through soldering. The receiver coils 5 thereby form an array of four coils and are cooled by a heat exchanger 7. Each of the four receiver coils 5 shown in FIG. 4, is connected to one of the cooled preamplifiers 16 via the flexible RF lines 10. In accordance with this embodiment, the four preamplifiers 16 may be connected to a thermal stage (heat sink) 23 within a second cooling circuit, as described in reference [6], with continuing cooling lines 21c, 21d of the coupling part 18b on the side of the cryocooler (FIG. 1).

In the embodiment of FIG. 4, the inventive coupling also comprises an automatic vacuum connection 31 with an O-ring 33. The vacuum connection 31 may be guided directly into the vacuum of the preamplifier housing 15b or advantageously to a separate vacuum line 38, which may be pumped by a pumping device in a controlled fashion alternately or simultaneously with a vacuum pump connection 37 of the preamplifier housing.

In order to ensure that the gap 13e (FIG. 3) of the RF line coupling device 32 can also be pumped, a vacuum seal 35 is provided around the coupling part 27 on the detecting device side. The RF plugs 39 must therefore no longer be vacuum-tight on the receiver coil side. Moreover, the further jacket 45 which surrounds the bulge (vacuum jacket 46) or the holder 48 need not be a closed jacket on the receiver coil side, but may only be a structure that transmits the pressure of the RF plugs 39.

In an alternative embodiment (not shown), the entire detecting device 3 including connecting lines 8 or connecting means 15c may also be provided with a permanent vacuum. In this case, the holder 48 must be designed as a closed jacket, and the ventilation opening 49 is omitted. The RF plugs 39 must also be vacuum-tight in this case. The vacuum connection 31 and the vacuum line 38 and pumping of the detecting device 3 after coupling and before cooling is no longer required. Instead, air condenses in the gap 13e (FIG. 3) during cooling, which is, however, not a problem.

The entire inventive coupling is pressed by a pressure element (not shown) with the required force, against the preamplifier housing 15b and held in the pressed-on position. The pressure must be sufficiently large to press all O-rings 24, 33, 34a, 34b, 35 in a sealing manner, and also to correctly position all RF connections of the RF line coupling device 32. This pressure element may normally consist of a union nut or be implemented with buckles, eccentrics or similar components.

The above-mentioned features may differ from the examples described in the figures in that e.g. different topologies or mirror images, are provided or the configuration of the two sides of the coupling etc. is exchanged.

The inventive MR probe head operates as follows:

The system is initially warm. No measuring insert (comprising detecting device 3, flexible connecting line 8 or rigid connecting line 15c and coupling 27 provided on the detecting device side) is mounted. In this state, the preamplifier housing 15b is usually already evacuated, since with this described structure, there is no need to break this vacuum for decoupling the previously used detecting device 3.

The desired measuring insert is then selected. It is at room temperature and is normally not evacuated. Its coupling part 27 on the detecting device side is inserted into the coupling part 28 on the preamplifier side in the preamplifier housing 15b and pressed into the correct position by the pressure element. All O-rings 24, 33, 34a, 34b, 35 thereby seal and the RF plugs 39 are pressed on with positive fit.

In order to prepare for cooling, the measuring insert is initially evacuated. This is done by connecting the vacuum line 38 to a vacuum pump system which is usually already present in such a system. In the meantime, the cooling lines 9a, 9b, 53a, 53b and the continuing cooling lines 21a, 21b, 21c, 21d are cleaned by repeated flushing with pure helium. This is always required in such devices in order to prevent freezing and blocking of the lines due to freezing of air or moisture. This is, in principle, only required for the cooling lines 9a, 9b, 53a, 53b and the two continuing cooling lines 21a, 21b of the receiver coil cooling, if the preamplifier part has not been changed.

The coldhead of the cryocooler 20 is then placed into operation and circulation in the cooling lines 9a, 9b, 53a, 53b, 21a, 21b is started. This cools the preamplifier 16 and also the receiver coils 5 to the respectively determined operating temperature, which is typically e.g. 77 K for the preamplifier 16 and 20 K for the receiver coils 5. The RF lines 10 and optionally 52 are also advantageously cooled to a temperature close to 20 K, essentially along their entire length.

Figure 5:
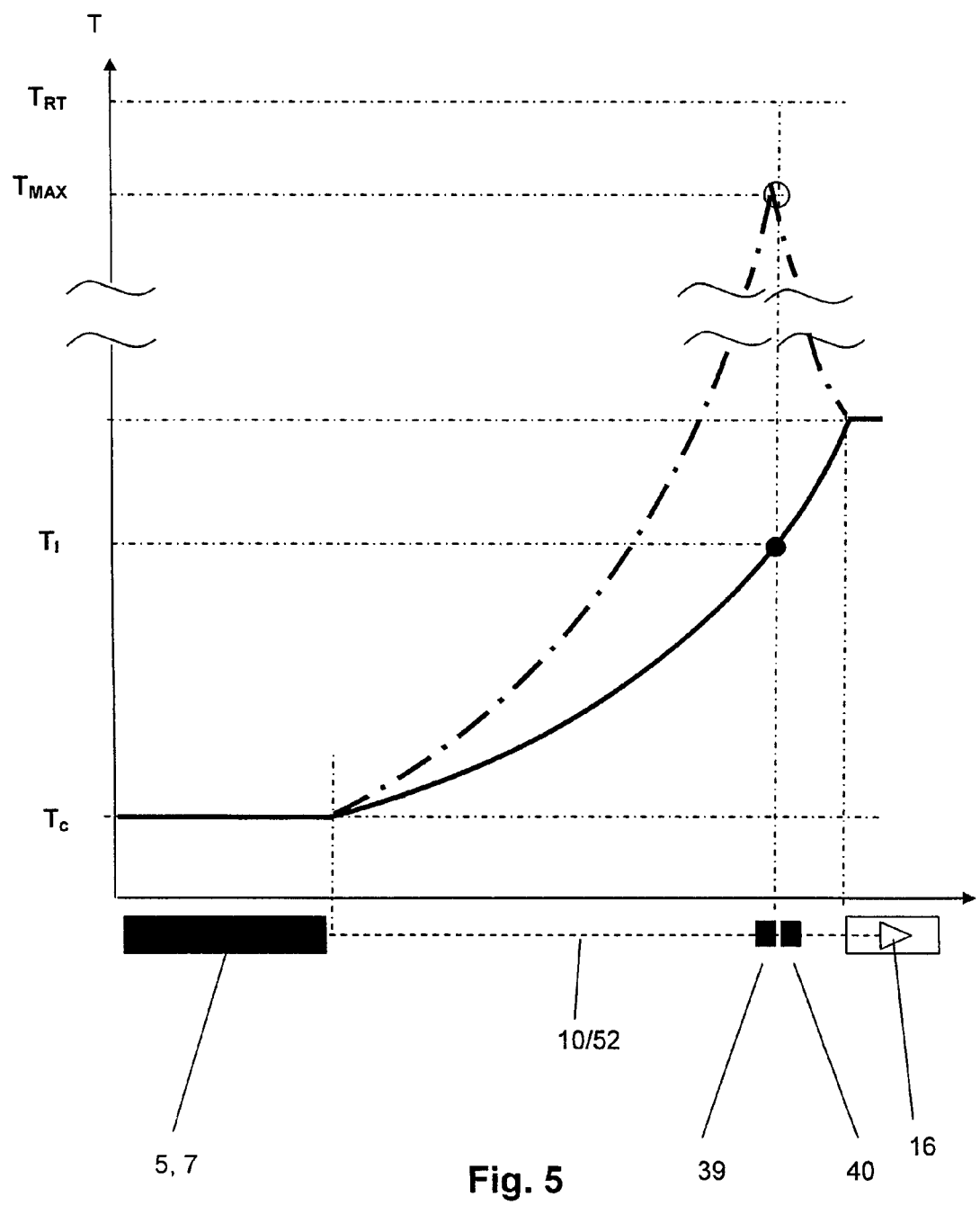
FIG. 5 shows a temperature dependence of an RF line of an inventive MR probe head in dependence on its running length.
Figure 6:
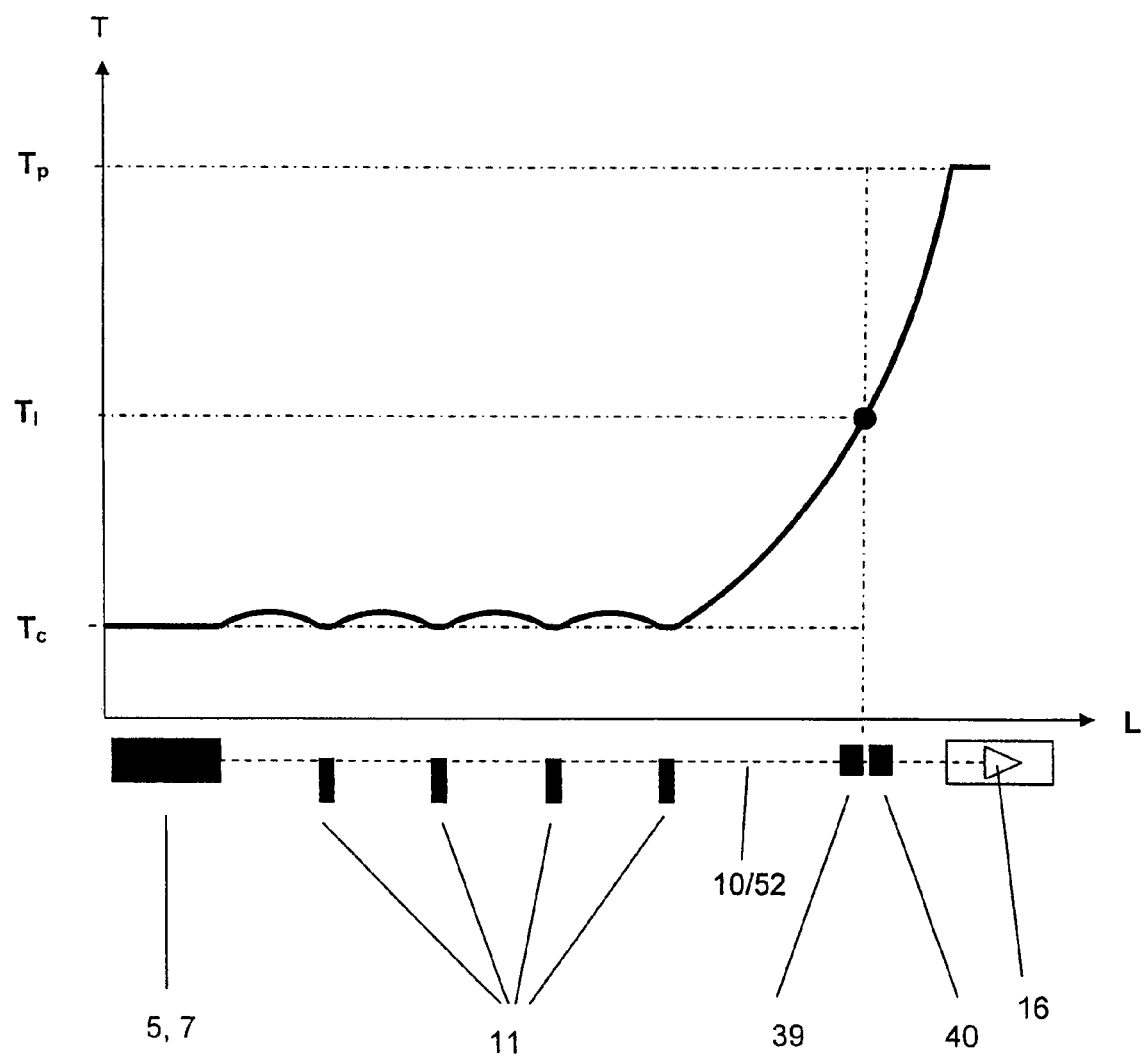
FIG. 6 shows a temperature dependence of a cooled RF line with coupling elements of an inventive MR probe head in dependence on its running length.

The RF lines 10, 52 should not be unnecessarily heated (i.e. surely not above the operating temperature of the preamplifier, in the present case 77 K). On the other hand, unnecessary heat input on the side of the cooling lines 9a, 9b, 53a, 53b, 21a, 21b should also be prevented. This is guaranteed by the inventive coupling design. The temperature of the RF lines 10, 52 is shown in FIG. 5 and FIG. 6 as a function of the longitudinal coordinate (position) L along the flexible connecting line 8 or along the rigid connecting means 15c. In the area of the receiver coils 5 and the heat exchanger 7, it is at approximately the temperature $T_c$ of the receiver coils 5. The RF plugs 39 and the RF sockets 40 are cooled to a minimum temperature $T_I$ without loading the first cooling circuit. Cooling is continued to a temperature which is below the temperature $T_p$ of the preamplifier 16 (fully drawn line). Cooling is preferably performed by the heat exchanger 26 (FIG. 4) which is disposed in the feed line of the preamplifier cooling line which is effected via the continuing cooling line 21c. As a consequence thereof, the He is, at that point, at a temperature below the preamplifier temperature $T_p$ of e.g. 77 K, i.e. e.g. 50 K. (only the He that exits the preamplifier 16 has a temperature of approximately 77 K, the He that enters the preamplifier 16 must have a lower temperature in order to enable cooling, i.e. to accept and discharge the heat generated in the preamplifier 16). In consequence thereof, the thermal stage 25 and thereby the vacuum jacket 46 of the RF line coupling device 32 are then cooled to approximately 50 K. The thermal gradient between room temperature and 50 K is thereby received by the further jacket 45. Due to cooling, in the ideal case, the RF plugs 39 and the RF sockets 40 also reach a temperature $T_I$ of this magnitude. In any event, they are not heated by the preamplifier temperature $T_p$ which could otherwise happen due to thermal conduction along the vacuum jacket 46. This does not disturb the gradual reduction of the temperature from 77 to 20 K.

FIG. 6 shows the temperature dependence of an RF line 10, optionally 52, with coupling elements 11. The cooling of the RF line 10 and optionally 52 is maintained by the more or less regular thermal connection of the RF line 10, and optionally 52, through the coupling elements 11 along the entire length between the coupling elements 11. They are at approximately the temperature $T_c$ of the receiver coils 5 or slightly below, since they are directly cooled by the cooling line(s) 9a, 9b, and optionally 53a, 53b. The feed 9a thereby always has a lower temperature than the receiver coil 5. The temperature dependence of the RF lines 10 and optionally 52 between the coupling elements 11 is approximately a square function. This permits fast reduction of the maximum excess temperature when required, through a tighter arrangement of the coupling elements 11. The thermal connections to the coupling elements 11 terminate on a precisely selected section shortly before the preamplifier 16. One then obtains a continuous transition between the temperature of the cooling line 9a, 9b, 53a, 53b and the preamplifier temperature $T_p$. The exact dependence depends on the thermal conductivity of the RF line 10 and optionally 52, as a function of the temperature, and on the external heat input, and is only schematically shown. The path length of this transition is dimensioned such that the total additional RF losses or the noise input of the warmer part of the RF line 10 and optionally 52, is minimized without forming an excessive heat bridge between the cooling lines 9a, 9b and optionally 53a, 53b and the preamplifiers 16. This cooling thereby even permits reduction of the average temperature of the RF cable in the area between the last coupling element 11 on the amplifier side and the preamplifier 16 when the geometries are adequately selected.

The heat exchanger 26 may alternatively also be mounted directly to the end plate of the RF coupling (not shown). The RF sockets 40 are then directly and very efficiently cooled.

Without this intermediate cooling of the vacuum jacket 46 or the RF plugs 39 and RF sockets 40, a direct thermal connection between the surroundings (room temperature $T_{RT}$) and the RF lines 10, 52 would be produced and the temperature of the RF line 10, 52 would have the dependence of the dash-dotted line shown in FIG. 5. This would increase the temperature of the RF line 10, 52 to an excessively high temperature $T_{MAX}$ which would cause an unnecessary deterioration in the S/N properties and at the same time an inadmissible heat input into it and thereby into the first cooling circuit.

After termination of the measurements, the measuring insert is exchanged as follows: The system is initially heated through circulation of warm He gas and possibly using individual electric heaters. The measuring insert vacuum is then broken and the measuring insert is removed. It can now be replaced by another one, followed by renewed cooling. In case of a flexible connecting line 8, these cooling and heating phases may take place while the inventive MR probe head is outside of the magnet 1. During this time, the magnet 1 may be used for other measurements.

The above-described coupling can be operated in a very simple fashion and even non-specialized staff can easily handle operation due to automated pumping, cooling and heating processes, accompanied by automatic connection of all lines and connections.

FIGS. 7 and 8 show two possible MR system configurations. FIG. 7 shows an NMR system for high-resolution NMR spectroscopy or micro imaging. FIG. 8 shows an MRI system for MR imaging.

The preamplifier housing 15b is mounted to the magnet 1, and connected to the cryocooler 20 via a coupling with coupling parts 18a, 18b, in accordance with prior art. The preamplifier 16 can include e.g. four 1 H preamplifiers and/or also different narrow- or wide-band amplifiers for nuclei such as e.g. 31P, 13C, 15N, 23Na, 19F, 2H etc. A measuring insert, comprising the detecting device 3, the flexible connecting line 8 and the inventive coupling with coupling parts 27, 28, is inserted into the preamplifier housing 15b and enters the magnet 1 via the flexible connecting line 8, where it terminates with the detecting device 3. The latter then measures MR signals of a test object 51 via the cooled receiver coil 5. Several measuring inserts are provided and may have the most different of coil configurations, between 1 and 4 coils in this example, and be exchanged as desired using the coupling parts 18a, 18b. If, at some point, the preamplifier 16 does not meet all requirements, it may be replaced or supplemented by another variant that is designed for other nuclei, such as e.g. 31P or 23Na.

The measuring insert may be designed for the most different of applications, from MR imaging to spectroscopic high-resolution applications, and can be removed from the magnet 1 at any time and be replaced by other inserts. This creates a system which is very easy to handle and can be universally used.

Other variations and embodiments of the described system are also possible. Although it seems advisable in view of space requirements, minimum complexity, and maximum efficiency (lowest possible temperatures) to locate the inventive coupling with its coupling parts 27, 28 at the end of the flexible connecting line 8 on the side of the preamplifier, or the rigid connecting means 15c, the coupling need not necessarily be disposed there but may also be disposed on the side of the detecting device 3 or anywhere in between. In the first case, in particular, the connecting line 8 or the connecting means 15c would have to be acquired only once, together with the preamplifier housing 15b, and the measuring insert would then consist only of the detecting device 3 and the coupling part 27, which would then be much more compact.

The inventive MR probe head realizes both good performance and easy handling, since the detecting device 3, i.e. the end of the MR probe head is small, light-weight and can be easily replaced in view of the inventive coupling. Moreover, the cost for replacement inserts can be reduced.

LIST OF REFERENCE NUMERALS 1 magnet
2 room temperature bore of the magnet
3 detecting device
5 receiver coil
7 heat exchanger for cooling the receiver coil
8 flexible connecting line between the detecting device and the preamplifier
8a corrugated bellows
9a flexible cooling line for coil cooling (feed)
9b flexible cooling line for coil cooling (return)
10 flexible RF line
11 coupling element between the cooling line and the RF line
13e gap of the RF line coupling device (preferably evacuated)
15a preamplifier housing as a part of the probe head
15b separate preamplifier housing
15c rigid connecting means between the detecting device and the preamplifier housing
16 cooled preamplifier
17 signal output at the output of the preamplifier
18a coupling part on the side of the preamplifier, between the preamplifier housing and the cryocooler
18b coupling part on the side of the cryocooler between the preamplifier housing and the cryocooler
19 transfer line between the cryocooler and the probe head
20 cryocooler
21a continuing cooling line
21b continuing cooling line
21c continuing cooling line
21d continuing cooling line
22 room temperature tube
23 thermal stage (heat sink) of the cooled preamplifier(s)
24 O-ring between the room temperature tube and the room temperature feed through
25 thermal stage for intermediate cooling of the jacket of the RF coupling
26 heat exchanger for intermediate cooling of the jacket of the RF coupling
27 coupling part on the detecting device side, between the detecting device and the preamplifier housing
28 coupling part on the preamplifier side, between the detecting device and the preamplifier housing
29 fluid coupling element of the fluid coupling device between the detecting device and the preamplifier housing (feed)
30 fluid coupling element of the fluid coupling device between the detecting device and preamplifier housing (return)
31 vacuum connection for the detecting device
32 RF line coupling device
33 O-ring for sealing the vacuum connection
34a O-ring for sealing the feed of the fluid coupling device
34b O-ring for sealing the return of the fluid coupling device
35 O-ring for sealing the RF line coupling device
37 vacuum pump connection for the preamplifier housing
38 vacuum line for the detecting device
39 HF plug on the detecting device (can be displaced)
40 RF socket
41 continuing RF line between the RF line coupling device and the preamplifier
42 spring element for the RF plug
43 guiding part for the RF plug
44 counter plate for force adoption
45 further jacket of RF coupling
46 vacuum jacket of the RF line coupling device
48 holder of the plug part
49 ventilation opening in the holder of the RF plug
50 measuring sample
51 test object
52 rigid RF line within the probe head
53a rigid cooling line within the probe head (feed)
53b rigid cooling line within the probe head (return)
54a cooling line section (feed) on the side of the preamplifier
54b cooling line section (return) on the side of the preamplifier
$T_P$ temperature of the preamplifier
$T_C$ temperature of the receiver coil
$T_{RT}$ room temperature
$T_I$ interface temperature of the RF line at the point of the RF plugs
L running length along the RF line (coordinate)

REFERENCE LIST

[1] WO2003/050554 A1
[2] DE 196 48 253 A1
[3] DE 199 46 371 C1
[4] "Cryogenic probe setup for routine MR imaging on small animals at 9.4 T", R. Haueisen, D. Marek, M. Sacher, F. Kong, K. Ugurbil, S. Junge, ESMRM Basel, 16. Sept. 2005
[5] U.S. Pat. No. 5,829,791
[6] U.S. Pat. No. 5,889,456

We claim:

1. A magnetic resonance probe head comprising:
a first housing having a first housing interface;
at least one detecting device disposed in said first housing, said detecting device having an antenna system;
at least one first cooling line disposed in said first housing and extending from said first housing interface to said antenna system to cryogenically cool said antenna system;
at least one first RF line disposed in said first housing and extending between said antenna system and said first interface for transmitting electrical signals;
a second housing having a second housing interface;
a cooled preamplifier disposed in said second housing;
a second cooling line disposed in said second housing and extending to said second housing interface;
a second RF line disposed in said second housing and extending from said preamplifier to said second housing interface; and
thermally insulating connecting means having a first member disposed at said first housing interface and a second member disposed at said second housing interface, said connecting means effecting separable coupling of said first cooling line to said second cooling line to pass coolant from said preamplifier housing to said antenna, said connecting means also effecting separable connection between said first RF line and said second RF line to pass said electrical signals from said antenna system to said preamplifier.

2. The MR probe head of claim 1, wherein the probe head is a probe head for magnetic resonance imaging (MRI) applications or for NMR (nuclear magnetic resonance) spectroscopy.

3. The MR probe head of claim 1, wherein at least two cooling lines have a first cooling circuit for cooling said antenna system.

4. The MR probe head of claim 3, wherein said connecting means comprises a fluid coupling device with fluid coupling elements for coupling said first cooling line to said second cooling line and an RF line coupling device comprising at least one first RF line coupling element or an RF plug at said first interface and at least one second RF line coupling element or an RF socket at said second interface for coupling RF signals to an input of said preamplifier.

5. The MR probe head of claim 4, further comprising a spring element for at least one pair of first and second RF coupling elements, said spring element urging said first RF coupling element against an associated said second RF coupling element.

6. The MR probe head of claim 4, wherein said RF coupling elements and/or a vacuum jacket which surrounds said first RF coupling element are cooled by a thermal stage.

7. The MR probe head of claim 6, wherein said thermal stage is thermally connected to a heat exchanger of said preamplifier, to a thermal stage of said preamplifier, or to said preamplifier.

8. The MR probe head of claim 6, further comprising a second cooling circuit to cool electronics of said preamplifier, said second cooling circuit being separate from said first cooling circuit.

9. The MR probe head of claim 8, further comprising a heat exchanger for cooling said thermal stage of said RF line coupling elements, said heat exchanger disposed in a feed line of said second cooling circuit or through a return line of said first cooling circuit.

10. The MR probe head of claim 6, wherein said thermal stage has a temperature below a preamplifier temperature during operation thereof.

11. The MR probe head of claim 1, wherein said connecting means comprises a vacuum connection for coupling to a vacuum line.

12. The MR probe head of claim 1, wherein said connecting means comprising a mechanically flexible connecting line with mechanically flexible RF and cooling lines.

13. The MR probe head of claim 1, wherein one or more RF lines are associated with one single cooling line to form a line package.

14. The MR probe head of claim 13, wherein said first cooling and said first RF lines of a common line package are thermally connected to each other or connected to each other in regular intervals via coupling elements having good thermal conductivity.

15. The MR probe head of claim 13, wherein at least one said line package contains at least one elastic reinforcing element or a wire having high mechanical strength.

16. The MR probe head of claim 13, wherein an individual said line package is twisted or twisted at least once about a connecting line along an entire connecting line length.

17. The MR probe head of claim 13, wherein RF lines and/or elastic reinforcing elements within a line package are twisted with a cooling line between two coupling elements through substantially 360 degree, through an integer multiple thereof, or are wound about a cooling line.

18. The MR probe head of claim 12, wherein an RF line comprises a flexible coaxial cable with polytetrafluoroethylene (PTFE) insulation, wherein an outer conductor comprises a combination of a metal braiding and a spirally wound metal foil having good electrical conducting properties.

19. The MR probe head of claim 12, wherein connecting line cold parts, cooling lines, or RF lines are disposed for thermal insulation in a vacuum within at least one flexible outer jacket.

20. The MR probe head of claim 8, wherein said first and said second cooling circuits are cooled by a common cooling device.

21. The MR probe head of claim 1, wherein a cooling medium is helium.

22. The MR probe head of claim 1, wherein a cooling device is a Gifford-McMahon cooler.

23. The MR probe head of claim 1, wherein a cooling device is a pulse tube cooler.

24. The MR probe head of claim 1, wherein said antenna system is operated at a lower temperature than said preamplifier.

25. The MR probe head of claim 24, wherein said antenna system is operated at a temperature in a range between 4 and 40 K and said preamplifier is operated at a temperature in a range between 40 and 100 K.

26. The MR probe head of claim 12, wherein a separation between said preamplifier and a last coupling element on a preamplifier side is larger than an average separation between two coupling elements.

27. The MR probe head of claim 1, wherein a mass of said detecting device parts is less than 5 kg.

28. The MR probe head of claim 2, wherein said preamplifier comprises several parallel preamplifier channels.

29. The MR probe head of claim 28, wherein said preamplifier comprises several, 2, 3, 4, 6, 8, 12 or 16 parallel channels for a same nucleus to be examined or for 1H.

30. The MR probe head of claim 29, wherein said preamplifier comprises channels for amplifying signals of the nuclei 31P, 13C, 23Na, 19F, 17O, 129Xe or 2H.

31. An MR system with the MR probe head of claim 1.

32. The MR system of claim 31, wherein the system is an MRI or NMR system.

\* \* \* \* \*